United States Patent
Cheah et al.

(10) Patent No.: US 10,403,604 B2
(45) Date of Patent: Sep. 3, 2019

(54) STACKED PACKAGE ASSEMBLY WITH VOLTAGE REFERENCE PLANE

(71) Applicant: Intel Corporation, Santa Clara, CA (US)

(72) Inventors: Bok Eng Cheah, Bayan Lepas (MY); Jackson Chung Peng Kong, Tanjung Tokong (MY); Ping Ping Ooi, Butterworth (MY); Kooi Chi Ooi, Gelugor (MY); Shanggar Periaman, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/766,150

(22) PCT Filed: Nov. 5, 2015

(86) PCT No.: PCT/US2015/059191
§ 371 (c)(1),
(2) Date: Apr. 5, 2018

(87) PCT Pub. No.: WO2017/078717
PCT Pub. Date: May 11, 2017

(65) Prior Publication Data
US 2018/0294252 A1    Oct. 11, 2018

(51) Int. Cl.
*H01L 25/065* (2006.01)
*H01L 23/552* (2006.01)
(Continued)

(52) U.S. Cl.
CPC ........ *H01L 25/0657* (2013.01); *H01L 21/568* (2013.01); *H01L 23/552* (2013.01);
(Continued)

(58) Field of Classification Search
CPC ..... H01L 21/568; H01L 23/552; H01L 24/19; H01L 24/20; H01L 25/0657; H01L 25/50; H01L 25/105
See application file for complete search history.

(56) References Cited

U.S. PATENT DOCUMENTS 6,744,130 B1  6/2004 Miller et al.
2004/0238970 A1  12/2004 Alcoe
(Continued)

OTHER PUBLICATIONS

International Search Report and Written Opinion dated Jul. 28, 2016 for International Application No. PCT/US2015/059191, 14 pages.
(Continued)

*Primary Examiner* — Peniel M Gumedzoe
(74) *Attorney, Agent, or Firm* — Schwabe, Williamson & Wyatt, P.C.

(57) ABSTRACT

Embodiments of the present disclosure are directed toward a stacked package assembly for embedded dies and associated techniques and configurations. In one embodiment, stacked package assembly may comprise a first die package and a second die package stacked one upon the other with plural interconnections between them; and a voltage reference plane embedded in at least one of the first and second die packages in proximity and generally parallel to the other of the first and second die packages.

18 Claims, 8 Drawing Sheets

(51) Int. Cl.
*H01L 23/00* (2006.01)
*H01L 25/10* (2006.01)
*H01L 25/00* (2006.01)
*H01L 21/56* (2006.01)
*H01L 23/498* (2006.01)
*H01L 23/50* (2006.01)

(52) U.S. Cl.
CPC .............. *H01L 24/19* (2013.01); *H01L 24/20* (2013.01); *H01L 25/105* (2013.01); *H01L 25/50* (2013.01); *H01L 23/49816* (2013.01); *H01L 23/49822* (2013.01); *H01L 23/49838* (2013.01); *H01L 23/50* (2013.01); *H01L 2224/04105* (2013.01); *H01L 2224/12105* (2013.01); *H01L 2224/32145* (2013.01); *H01L 2224/32225* (2013.01); *H01L 2224/48227* (2013.01); *H01L 2224/73265* (2013.01); *H01L 2225/0651* (2013.01); *H01L 2225/06555* (2013.01); *H01L 2225/06568* (2013.01); *H01L 2225/1035* (2013.01); *H01L 2225/1058* (2013.01); *H01L 2924/15311* (2013.01); *H01L 2924/181* (2013.01); *H01L 2924/1816* (2013.01); *H01L 2924/18162* (2013.01)

(56) References Cited

U.S. PATENT DOCUMENTS

| | | |
|---|---|---|
| 2006/0118937 A1 | 6/2006 | Katagiri et al. |
| 2008/0290474 A1* | 11/2008 | Chun ...................... H01L 23/66 257/664 |
| 2010/0327452 A1* | 12/2010 | Kobayashi ........ H01L 23/49811 257/773 |
| 2011/0215448 A1 | 9/2011 | Cho et al. |
| 2014/0015132 A1 | 1/2014 | Rotem |
| 2014/0061877 A1* | 3/2014 | Lin ........................ H01L 24/82 257/659 |
| 2014/0091442 A1 | 4/2014 | Cheah et al. |
| 2014/0175619 A1 | 6/2014 | Yee et al. |
| 2014/0367160 A1 | 12/2014 | Yu et al. |
| 2015/0130070 A1* | 5/2015 | Lin ...................... H01L 23/481 257/774 |
| 2015/0243633 A1 | 8/2015 | Chen |

OTHER PUBLICATIONS

Extended Search Report dated Jun. 21, 2019 for European Application No. 15907962.3, 10 pages.

\* cited by examiner

STACKED PACKAGE ASSEMBLY WITH VOLTAGE REFERENCE PLANE

CROSS REFERENCE TO RELATED APPLICATIONS

The present application is a national phase entry under 35 U.S.C. § 371 of International Application No. PCT/US2015/059191, filed Nov. 5, 2015, entitled "STACKED PACKAGE ASSEMBLY WITH VOLTAGE REFERENCE PLANE", which designated, among the various States, the United States of America. The Specifications of the PCT/US2015/059191 Application is hereby incorporated by reference.

TECHNICAL FIELD

Embodiments of the present disclosure generally relate to the field of integrated circuits, and more particularly, to a stacked package assembly for embedded dies and associated techniques and configurations.

BACKGROUND

Currently, stacked integrated circuit (IC) package assemblies may include package-on-package (PoP) configurations in which first and second packages are stacked together, one on the other, with electrical connections between them. For example, the first package may include a processor and the second package may include a memory component. Incidental electrical coupling, such as crosstalk and electromagnetic interference (EMI), may occur as signals are transmitted between the packages.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1:
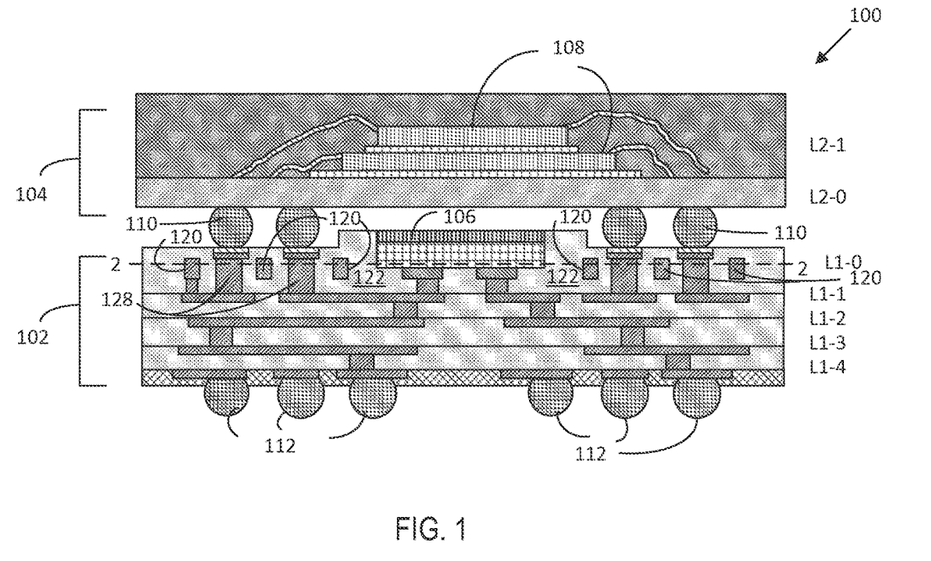
FIG. 1 is a simplified cross-sectional side view of a stacked integrated circuit (IC) package assembly, in accordance with some embodiments.

FIG. 1 schematically illustrates a cross-section side view of an example stacked integrated circuit (IC) package assembly (hereinafter "package assembly 100"), in accordance with some embodiments. The package assembly 100 may include a first package 102 and a second package 104 that are stacked together, one on the other. First package 102 may be referred to as a base package and may include one or more dies 106 (e.g., only one shown), and second package 104 may be referred to as a top package and may include one or more dies 108 (e.g., two dies shown). One or more dies 106 may include one or more logic dies such as, for example, a processor, CPU, or ASIC, and one or more dies 108 may include one or more memory dies such as, for example, low power double data rate memory. Dies 106 and/or 108 may be constructed to perform other functions in other embodiments.

In the example of package assembly 100, first package 102 may include multiple layers, such as layers L1-0, L1-1, L1-2, L1-3, L1-4, or more or fewer layers, which may include arrangements of insulative and conductive materials. Second package 104 may include multiple layers, such as layers L2-0, L2-1, or more or fewer layers, which may include arrangements of insulative and conductive materials. Multiple electrical couplings 110 may provide electrical connection between first package 102 and second package 104, and multiple electrical couplings 112 may provide electrical connection between package assembly 100 and other devices, such as through connection to a printed circuit board, for example. Electrical couplings 110 and 112 may each include a ball grid array integrated circuit package, or any other suitable type of integrated circuit coupling or packaging.

Package assembly 100 may also include a conductive voltage reference plane 120 that may be embedded in at least one of first package 102 and second package 104. Voltage reference plane 120 may be in proximity to and generally parallel to the other of first package 102 and second package 104. In the example of package assembly 100, voltage reference plane 120 may be embedded in a dielectric 122 at layer L1-0 of first package 102 in proximity to second package 104. Voltage reference plane 120 may have applied to it one or more reference or shielding voltages.

Figure 2:
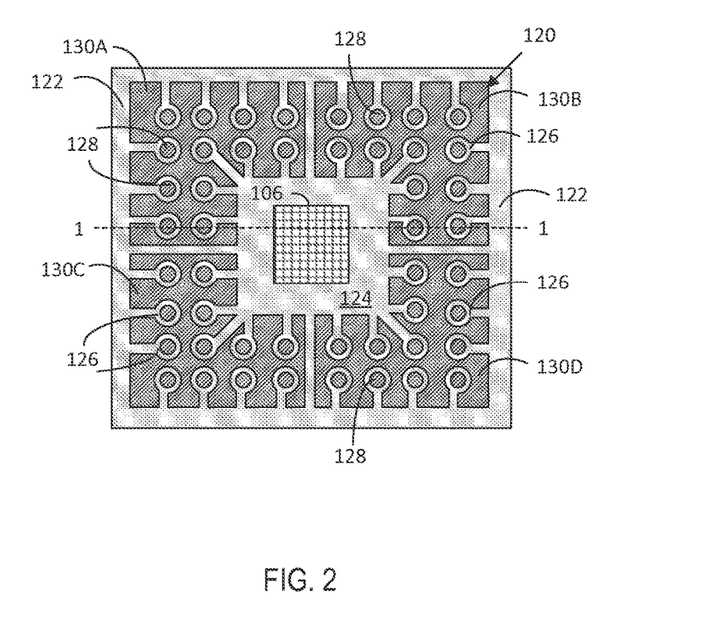
FIG. 2 is a sectional top view of a first package of FIG. 1 illustrating a voltage reference plane, in accordance with various embodiments.

FIG. 2 is a sectional top view of first package 102 illustrating voltage reference plane 120, which may extend substantially across first package 120 and may include a major aperture 124 for one or more dies 106. For example, one or more dies 106 may be aligned with and/or extend at least partly through major aperture 124. Voltage reference plane 120 may further include one or more minor apertures 126 through which one or more electrical connections or vias 128 may pass through voltage reference plane 120 in electrical isolation from it.

Voltage reference plane 120 may include one or more portions or sub-planes 130 that may be co-planar with and electrically isolated from each other. In the example of FIG. 2, voltage reference plane 120 may include four sub-planes 130A-130D that may be arranged in a rectangular (e.g., square) array. It will be appreciated that voltage reference plane 120 may include more, fewer, or no sub-planes, and that any sub-planes may be configured and arranged in any manner. Voltage reference plane 120 may include one or more electrical connections to one or more reference voltages, such as a source voltage Vss, in one embodiment.

Voltage reference plane 120 may provide embedded shielding at layer L1-0 of first package 102 that may mitigate incidental electrical coupling, such as crosstalk and electromagnetic interference (EMI), as signals are transmitted between packages 102 and 104 through electrical couplings 110 and electrical connections 128. In embodiments, voltage reference plane 120 may provide increased signal-to-ground ratios in signals transmitted between packages 102 and 104, may provide or allow increased density of interconnections between packages 102 and 104 of package assembly 100, and may provide improved signal quality through vertical and horizontal voltage (e.g., ground) referencing without increasing the number of layers in or stacked (z-axis) height of the package assembly. The voltage reference plane 120 may also provide high data-rate scalability through robust noise shielding and voltage (e.g., ground) referencing and may provide a reduced package foot-print by reduction in number of reference voltage (e.g., Vss) interconnects.

The dies 106 and/or 108 may represent or include discrete products made from a semiconductor material (e.g., silicon) using semiconductor fabrication techniques such as thin film deposition, lithography, etching and the like used in connection with forming complementary metal-oxide semiconductor (CMOS) devices. In some embodiments, the dies 106 and/or 108 may be, include, or be a part of a processor, memory, system on a chip (SoC) or application-specific IC (ASIC). In some embodiments, an electrically insulative material such as, for example, molding compound or underfill material (not shown) may encapsulate at least a portion of the dies 106 and/or 108.

Figure 3A:
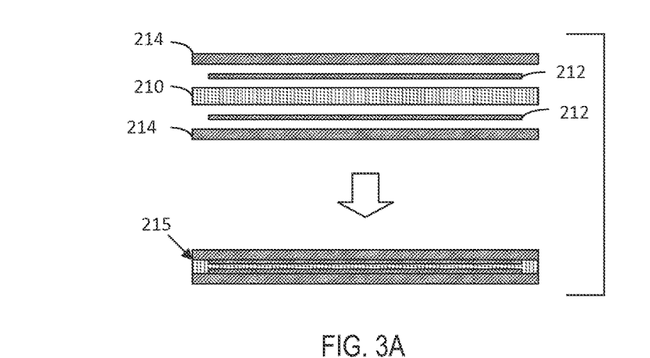
FIGS. 3A-3R are simplified cross-sectional side views of stages of manufacturing the stacked IC package assembly of FIG. 1, in accordance with various embodiments.
Figure 3B:
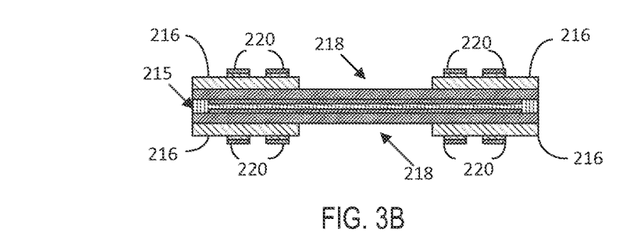
Figure 3C:
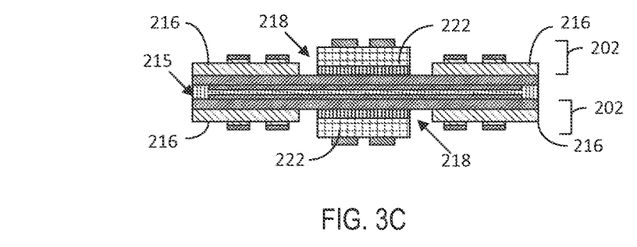
Figure 3D:
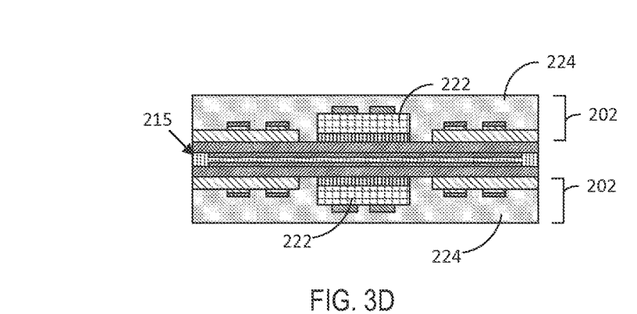
Figure 3E:
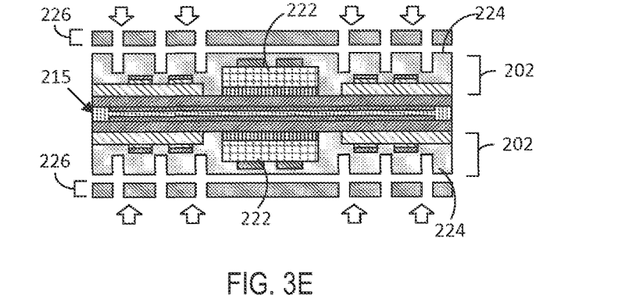
Figure 3F:
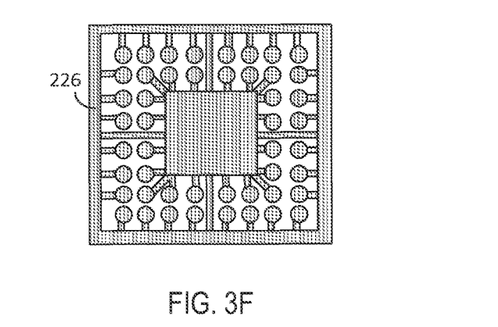
Figure 3G:
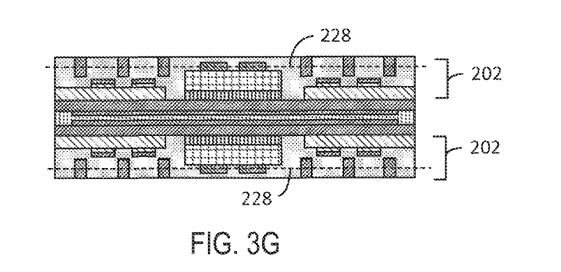
Figure 3H:
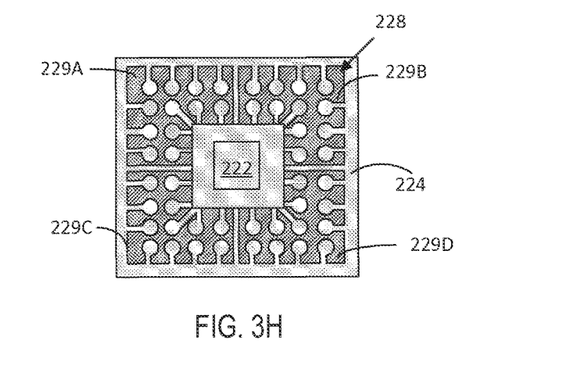
Figure 3I:
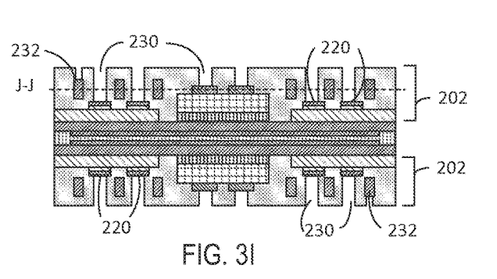
Figure 3J:
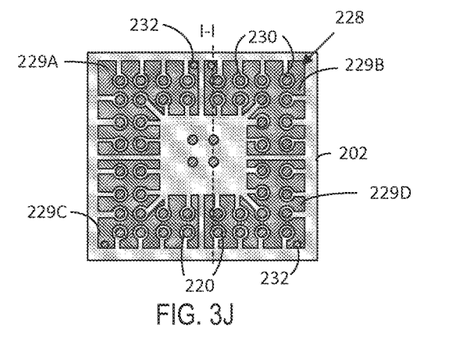
Figure 3K:
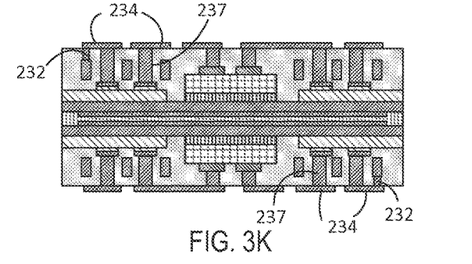
Figure 3L:
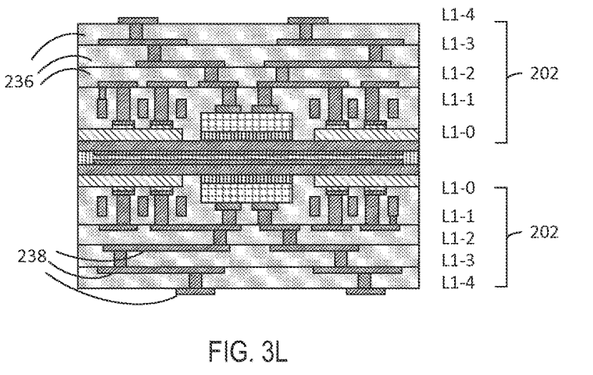
Figure 3M:
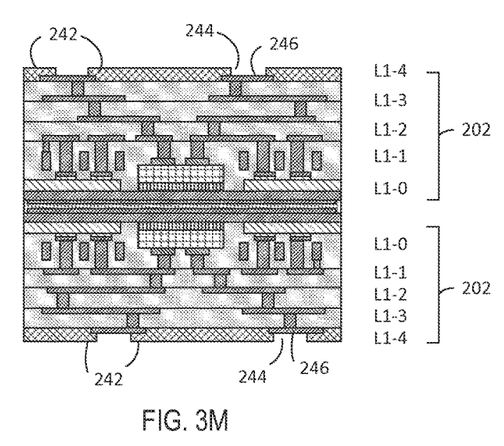
Figure 3N:
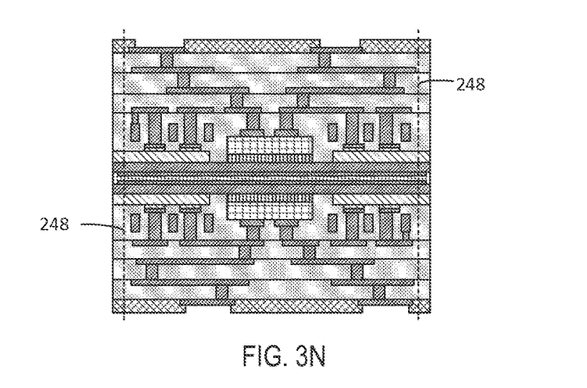
Figure 3O:
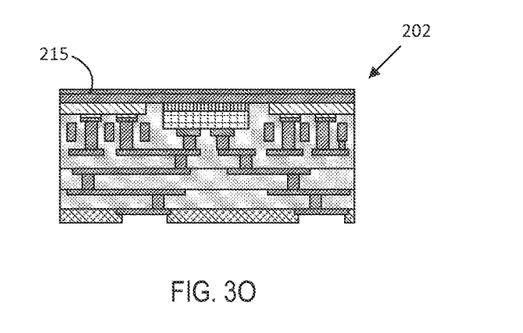
Figure 3P:
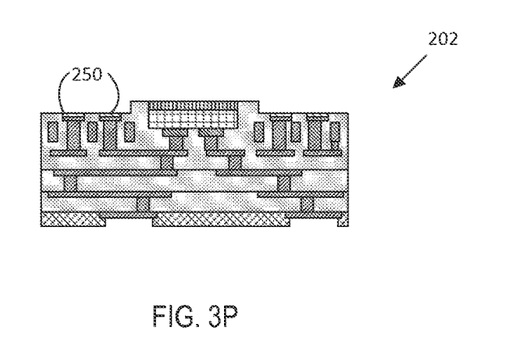
Figure 3Q:
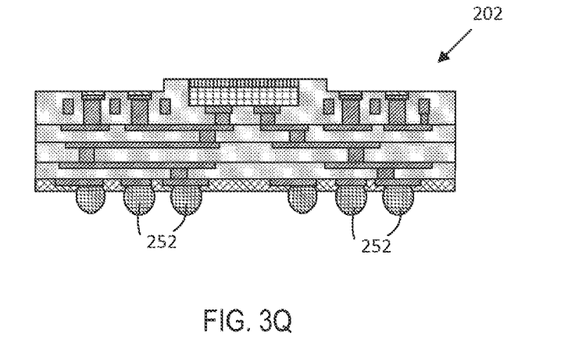
Figure 3R:
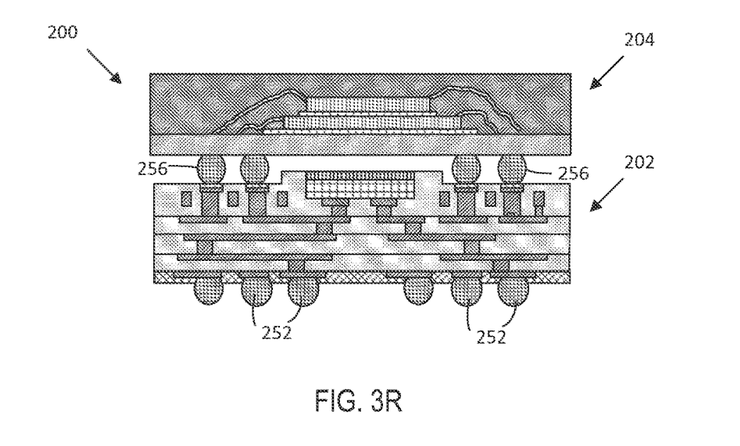

FIGS. 3A-3R schematically illustrate various stages of fabrication of an example stacked IC package assembly 200 (FIG. 3R, hereinafter "package assembly 200") that may include integrated circuit packages 202, 204 (FIG. 3R) that are stacked together, in accordance with some embodiments. FIGS. 3A-3Q schematically illustrate various stages of fabrication of an example first package 202 of package assembly 200, in reference to a two-sided fabrication technique. In other embodiments first package 202 could be fabricated in a one-sided fabrication technique. The package assembly 200, packages 202, 204, and their components, including dies, may comport with embodiments described in connection with package assembly 100, packages 102, 104, and their components, including dies, and vice versa.

FIG. 3A depicts a core material 210 with applied or laminated layers 212, 214 which may be of a metal such as, for example, copper, and may function as a fabrication carrier 215 to facilitate handling of first packages 202 during fabrication.

FIG. 3B depicts a pair of first packages 202 subsequent to coupling contact carriers 216 to fabrication carrier 215. Contact carriers 216 and fabrication carrier 215 may be coupled using any suitable technique and may form die attachment recesses or cavities 218 and may provide contact pads 220, such as ball grid array pads, for example.

FIG. 3C depicts dies 222 mounted in die attachment recesses or cavities 218 as first packages 202.

FIG. 3D depicts first packages 202 subsequent to application or lamination of embedding or encapsulating dielectric layers 224.

FIG. 3E depicts first packages 202 in which dielectric layers 224 may be exposed for etching with respect to a reference voltage plane etch mask or pattern 226, an embodiment of which is shown in plan in FIG. 3F. Etching of dielectric layers 224 may be done in any suitable manner including photolithography, plasma, UV, or laser etching, etc., according to mask or pattern 226.

FIG. 3G depicts first packages 202, in which each may include reference voltage plane 228, an embodiment of which may be shown in FIG. 3H and may include sub-plane 229A-229D. Reference voltage plane 228 may be formed in any suitable manner such as an electroplating process, which may include electroless or electrolytic processing.

FIG. 3I depicts first packages 202, which may include formation of one or more package assembly via paths 230, to contact pads 220, for example, and one or more reference voltage plane vias 232. Via paths 230 and recesses for vias 232 may be formed in any suitable manner such as dielectric lamination in combination with an etching process such as UV or CO2 laser etching. FIG. 3J depicts a sectional top view of a first package 202 of FIG. 3I.

FIG. 3K depicts first packages 202 with electrical connections 234 made between package assembly vias 237 and reference voltage plane vias 232 through which to apply one or more reference voltages to reference voltage planes 228, for example, or to provide other electrical connections. In embodiments formation of electrical connections 234 may be semi-additive and may employ an electroplating process. The one or more reference voltages may include a source voltage Vss.

FIG. 3L depicts first packages 202, which may include multiple additional layers such as, for example, layers L1-2 through L1-4, which may be formed with successive dielectrics 236, metal layers 238, and vias or micro-vias.

FIG. 3M depicts first packages 202, which may include solder resist layers 242 and solder resist openings 244 to solder contact pads 246. Solder resist layers 242 and solder resist openings 244 may be formed in a build-up process of solder resist film lamination, photolithography, and etching.

FIG. 3N depicts singulation and panel separation of first packages 202, which may include sawing or other separating or cutting along separation lines 248.

FIG. 3O depicts a singulated and panel-separated first package 202.

FIG. 3P depicts first package after removal of fabrication carrier 215, which may be removed by an etching process or peeling removal and may provide access to one or more package assembly contact pads 250.

FIG. 3Q depicts formation of conductive attachments 252, such as solder balls, to solder contact pads 246. In embodiments, conductive attachments 252 may be formed by a solder ball placement and reflow process and may be for connection to a ball grid array integrated circuit package or another suitable package.

FIG. 3R depicts a first package 202 and second package 204 stacked together as stacked package assembly 200 with package assembly connections 256, which may include a surface mounting technology. In embodiments, the stacked package assembly 200 may include a package-on-package (POP) device.

Figure 4:
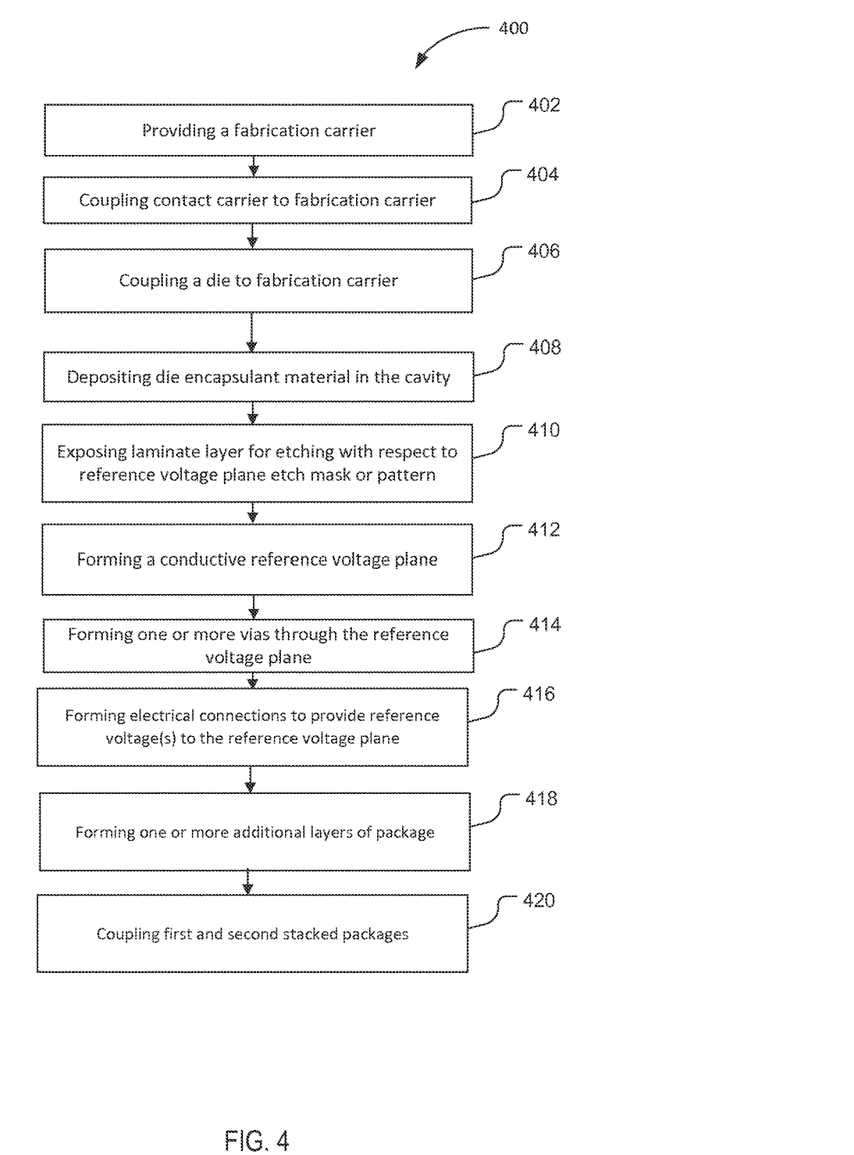
FIG. 4 is an example process for making the stacked IC package assembly of FIG. 1, in accordance with various embodiments.

FIG. 4 schematically illustrates a flow diagram for a method 400 of fabricating a stacked IC package assembly, in accordance with some embodiments. The method 400 may comport with techniques and/or configurations described in connection with FIGS. 1-3 and vice versa.

At 402, the method 400 may include providing a fabrication carrier (e.g., fabrication carrier 215 of FIG. 3A) to facilitate handling of a first package (e.g., packages 202 of FIGS. 3A-3Q) during fabrication. At 404, the method 400 may include coupling a contact carrier to the fabrication carrier (e.g., contact carrier 216 coupled to fabrication carrier 215 of FIG. 3B). In embodiments, the contact carrier may include a recess or cavity (e.g., cavity 218 of FIG. 3B). At 406, the method 400 may include coupling a first die (e.g., die 222 of FIG. 3C) to the fabrication carrier. In embodiments, the die may be coupled in a recess of the contact carrier (e.g., die 222 in recess 218 of FIG. 3C).

At 408, the method 400 may include depositing a die encapsulant or embedding material (e.g., dielectric material 224 of FIG. 3D) in the cavity. In some embodiments, depositing the die encapsulant material in the cavity may be performed by applying a laminate layer (e.g., dielectric material 224 of FIG. 3D) on the fabrication carrier and hot pressing the laminate layer to couple the laminate layer with the fabrication carrier and substantially fill the cavity with the laminate layer.

At 410, the method 400 may include exposing the laminate layer for etching with respect to a reference voltage plane etch mask or pattern (e.g., reference voltage plane etch mask or pattern 226 of FIG. 3F). Exposing the laminate layer for etching may be done in any suitable manner including photolithography, plasma, UV, or laser etching, etc.

At 412, the method 400 may include forming a conductive reference voltage plane (e.g., reference voltage plane 228 of FIG. 3H). The reference voltage plane may be formed in any suitable manner such as an electroplating process, which may include electroless or electrolytic processing.

At 414, the method 400 may include forming one or more vias through the reference voltage plane (e.g., one or more package assembly vias 230 and/or one or more reference voltage plane vias 232 of FIG. 3I). In embodiments, the one or more vias may provide electrical couplings through the reference voltage plane and may be formed in any suitable manner such as dielectric lamination in combination with an etching process such as UV or CO2 laser etching.

At 416, the method 400 may include forming electrical connections through which to provide one or more reference voltages to the reference voltage plane (e.g. electrical connection 234 of FIG. 3K). At 418, the method 400 includes formation of one or more additional layers of the first package (e.g., FIG. 3L).

At 420, the method 400 may include coupling the first package with a second package as a stacked IC package assembly (e.g., stacked package assembly 200 of FIG. 3R).

Various operations are described as multiple discrete operations in turn, in a manner that is most helpful in understanding the claimed subject matter. However, the order of description should not be construed as to imply that these operations are necessarily order-dependent. For example, actions of the method 400 may be performed in another suitable order than depicted.

Figure 5:
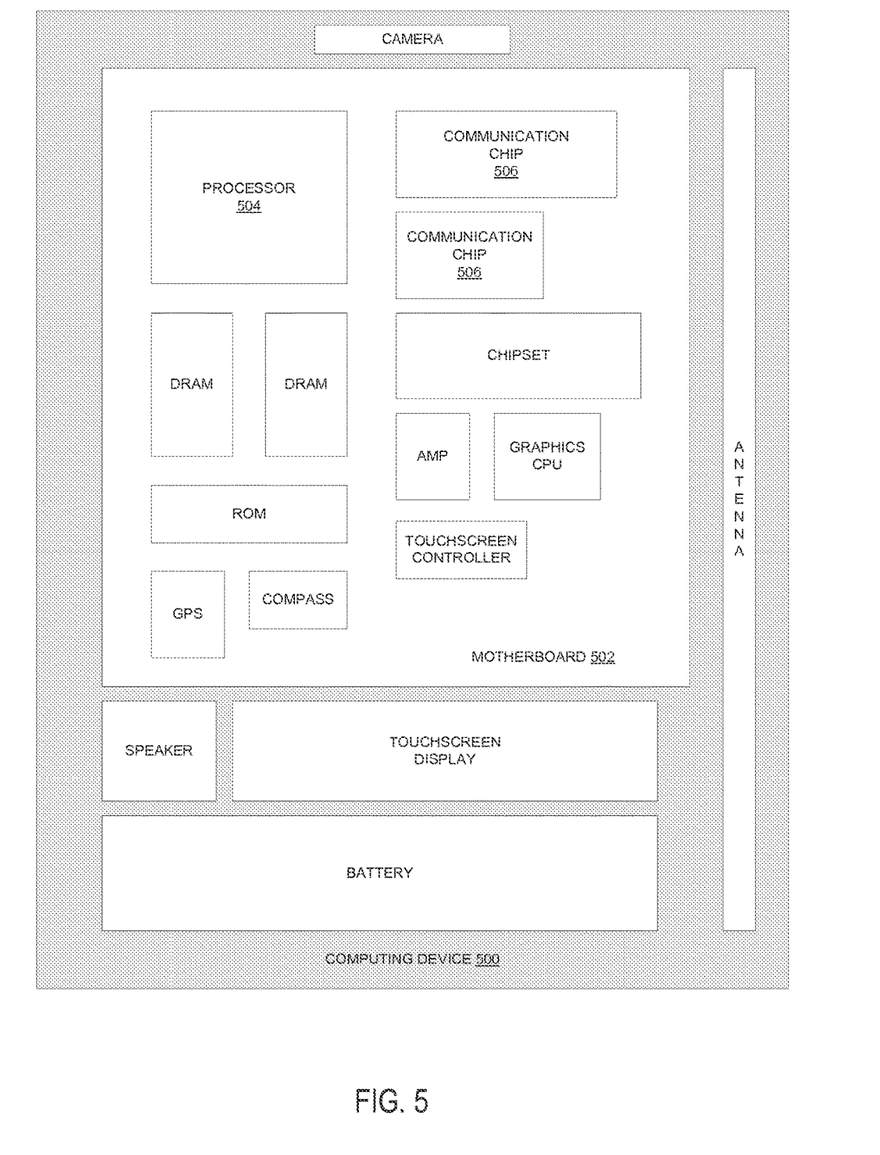
FIG. 5 schematically illustrates a computing device that may include one or more of the stacked IC package assemblies of FIG. 1, in accordance with some embodiments.

Embodiments of the present disclosure may be implemented into a system using any suitable hardware and/or software. FIG. 5 schematically illustrates a computing device 500 that may include a stacked IC package assembly as described herein, in accordance with some embodiments. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). The processor 504 of the computing device 500 may be packaged in a stacked IC package assembly with a memory, as described herein, and/or other components may be packaged together in a stacked IC package assembly with a memory, as described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an embodiment, the computing device 500 may be a mobile computing device. In further implementations, the computing device 500 may be any other electronic device that processes data.

Examples

Example 1 may include a stacked package assembly comprising a first die package and a second die package stacked one upon the other with plural interconnections between them; and a voltage reference plane embedded in at least one of the first and second die packages in proximity and generally parallel to the other of the first and second die packages.

Example 2 may include the package assembly of example 1 and/or any other example disclosed herein in which the voltage reference plane is embedded in the first die package and the first package includes an embedded logic die.

Example 3 may include the package assembly of example 2 and/or any other example disclosed herein in which the voltage reference plane includes a major aperture through which the embedded logic die at least partly extends.

Example 4 may include the package assembly of example 1 and/or any other example disclosed herein in which the voltage reference plane includes plural apertures for the plural interconnections between the first and second die packages.

Example 5 may include the package assembly of example 1 and/or any other example disclosed herein in which the voltage reference plane includes plural co-planar voltage reference sub-planes that include electrical isolation between them.

Example 6 may include the package assembly of example 5 and/or any other example disclosed herein in which the plural co-planar voltage reference sub-planes are arranged in a rectangular array.

Example 7 may include the package assembly of example 1 and/or any other example disclosed herein in which the voltage reference plane is embedded in a dielectric material.

Example 8 may include the package assembly of example 2 and/or any other example disclosed herein in which the embedded logic die includes a central processing unit.

Example 9 may include the package assembly of example 1 and/or any other example disclosed herein in which the second package includes a memory die.

Example 10 may include the package assembly of example 9 and/or any other example disclosed herein in which the memory die includes a low-power double data rate memory.

Example 11 may include a method of fabricating a stacked package assembly, the method comprising forming a first die package having an embedded first integrated circuit die, the forming the first die package including forming on the first die package a voltage reference plane substantially encompassing the first die package; forming a second die package having an embedded second integrated circuit die; and stacking the first die package and the second die package together with the embedded voltage reference plane in proximity to the second die package, the stacking the first die package and the second die package together including forming plural electrical interconnections between the first die package and the second die package.

Example 12 may include the method of example 11 and/or any other example disclosed herein in which forming the first die package includes embedding the voltage reference plane in a dielectric material.

Example 13 may include the method of example 11 and/or any other example disclosed herein in which forming the voltage reference plane includes forming the voltage reference plane with plural apertures for the plural electrical interconnections between the first die package and second die package.

Example 14 may include the method of example 11 and/or any other example disclosed herein in which forming the voltage reference plane includes forming the voltage reference plane with plural co-planar voltage reference sub-planes that include electrical isolation between them.

Example 15 may include the method of example 14 and/or any other example disclosed herein in which forming the voltage reference plane with plural co-planar voltage reference sub-planes includes forming the plural co-planar voltage reference sub-planes in a rectangular array.

Example 16 may include the method of example 11 and/or any other example disclosed herein in which forming the voltage reference plane includes providing an electrical connection to the voltage reference plane through which to apply a voltage reference to the voltage reference plane.

Example 17 may include the method of example 11 and/or any other example disclosed herein in which forming the voltage reference plane includes forming the voltage reference plane with a major aperture through which the embedded first integrated circuit die at least partly extends.

Example 18 may include a computing device comprising a circuit board; and a stacked package assembly coupled with the circuit board, the package assembly comprising:
first die package and a second die package with a first integrated circuit die and a second integrated circuit die, respectively, the first die package and the second die package being stacked one upon the other with plural interconnections between them; and a voltage reference plane embedded in at least one of the first and second die packages in proximity and generally parallel to the other of the first and second die packages.

Example 19 may include the computing device of example 18 and/or any other example disclosed herein in which the second die package is stacked upon the first die package and in which the first integrated circuit die includes a processor.

Example 20 may include the computing device of example 19 and/or any other example disclosed herein in which the second integrated circuit die includes memory.

Example 21 may include the computing device of example 18 and/or any other example disclosed herein in which the computing device is a mobile computing device further comprising one or more of an antenna, a display, a touchscreen display, a touchscreen controller, a battery, a power amplifier, a global positioning system (GPS) device, a compass, a speaker, and/or a camera coupled with the circuit board.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A stacked package assembly comprising:
   a first die package and a second die package stacked one upon the other with plural interconnections between them; and
   a voltage reference plane embedded in the first die package in a layer of a plurality of layers that are parallel to the second die package, wherein the layer is disposed in proximity to the second die package relative to remaining ones of the plurality of layers, wherein the voltage reference plane is to provide embedded shielding at the layer of the plurality of layers to mitigate crosstalk and electromagnetic interference during signal transmission between the first and second die packages,
   wherein the first die package includes an embedded logic die, wherein the voltage reference plane includes plural co-planar voltage reference sub-planes that are arranged in an array to form an aperture therebetween through which the embedded logic die at least partly extends.

2. The package assembly of claim 1, in which the voltage reference plane includes plural apertures between the first and second die packages.

3. The package assembly of claim 1, wherein the plural co-planar voltage reference sub-planes include electrical isolation between them.

4. The package assembly of claim 3, in which the plural co-planar voltage reference sub-planes are arranged in a rectangular array.

5. The package assembly of claim 1, in which the voltage reference plane is embedded in a dielectric material.

6. The package assembly of claim 1, in which the embedded logic die includes a central processing unit.

7. The package assembly of claim 1, in which the second package includes a memory die.

8. The package assembly of claim 7, in which the memory die includes a low-power double data rate memory.

9. A method of fabricating a stacked package assembly, the method comprising:
   forming a first die package having an embedded first integrated circuit die, the forming of the first die package including forming in the first die package a voltage reference plane substantially encompassing the first die package, wherein forming the voltage reference plane includes providing the voltage reference plane in a layer of a plurality of layers that are parallel to a second die package, wherein the layer is disposed in proximity to the second die package relative to remaining ones of the plurality of layers, wherein forming the voltage reference plane further includes providing plural co-planar voltage reference sub-planes arranged in an array to form an aperture therebetween through which the first integrated circuit die at least partly extends;
   forming the second die package having an embedded second integrated circuit die; and
   stacking the first die package and the second die package together with the embedded voltage reference plane in proximity to the second die package, the stacking the first die package and the second die package together including forming plural electrical interconnections between the first die package and the second die package, wherein the voltage reference plane is to provide embedded shielding at the layer of the plurality of layers to mitigate crosstalk and electromagnetic interference during signal transmission between the first and second die packages.

10. The method of claim 9, in which forming the first die package includes embedding the voltage reference plane in a dielectric material.

11. The method of claim 9, in which forming the voltage reference plane includes forming the voltage reference plane with plural apertures between the first die package and second die package.

12. The method of claim 9, wherein the plural co-planar voltage reference sub-planes include electrical isolation between them.

13. The method of claim 12, in which forming the voltage reference plane with plural co-planar voltage reference sub-planes includes forming the plural co-planar voltage reference sub-planes in a rectangular array.

14. The method of claim 9, in which forming the voltage reference plane includes providing an electrical connection to the voltage reference plane through which to apply a voltage reference to the voltage reference plane.

15. A computing device comprising:
   a circuit board; and
   a stacked package assembly coupled with the circuit board, the package assembly comprising:
   first die package and a second die package with a first integrated circuit die and a second integrated circuit die, respectively, the first die package and the second die package being stacked one upon the other with plural interconnections between them; and a voltage reference plane embedded in the first die package in a layer of a plurality of layers that are parallel to the second die package, wherein the layer is disposed in proximity to the second die package relative to remaining ones of the plurality of layers, wherein the voltage reference plane is to provide embedded shielding at the layer of the plurality of layers to mitigate crosstalk and electromagnetic interference during signal transmission between the first and second die packages, wherein the voltage reference plane includes plural co-planar voltage reference sub-planes that are arranged in an array to form an aperture therebetween through which a first integrated logic die at least partly extends.

16. The computing device of claim 15, in which the second die package is stacked upon the first die package and in which the first integrated circuit die includes a processor.

17. The computing device of claim 16, in which the second integrated circuit die includes memory.

18. The computing device of claim 15, in which the computing device is a mobile computing device further comprising one or more of:

an antenna, a display, a touchscreen display, a touchscreen controller, a battery, a power amplifier, a global positioning system (GPS) device, a compass, a speaker, and/or a camera coupled with the circuit board.

* * * * *